US006853551B2

(12) United States Patent
Baar et al.

(10) Patent No.: US 6,853,551 B2
(45) Date of Patent: Feb. 8, 2005

(54) TELECOMMUNICATION CHASSIS

(75) Inventors: Douglas W. Baar, Yorba Linda, CA (US); Gregorio Derobles, Ontario, CA (US); Dennis V. Martin, Glendale, CA (US); Alfredo T. Bernardo, Pasadena, CA (US)

(73) Assignee: GNP Computers, Inc., Monrovia, CA (US)

( * ) Notice: Subject to any disclaimer, the term of this patent is extended or adjusted under 35 U.S.C. 154(b) by 0 days.

(21) Appl. No.: 10/185,271

(22) Filed: Jun. 28, 2002

(65) Prior Publication Data
US 2004/0001320 A1 Jan. 1, 2004

(51) Int. Cl.[7] ................................ G06F 1/20
(52) U.S. Cl. .............. 361/687; 361/722; 710/309; 345/519
(58) Field of Search ............... 361/724–727, 361/679–687; 710/309–313; 345/503, 519; 439/61

(56) References Cited

U.S. PATENT DOCUMENTS

| 5,398,161 A | * | 3/1995 | Roy .................... 361/727 |
| 5,430,607 A | * | 7/1995 | Smith .................. 361/683 |
| 5,570,270 A | | 10/1996 | Naedel et al. |
| 5,816,673 A | | 10/1998 | Sauer et al. |
| 5,865,518 A | | 2/1999 | Jarrett et al. |
| 5,892,654 A | | 4/1999 | Worden, Jr. |
| 6,052,281 A | | 4/2000 | Hardt et al. |
| 6,058,011 A | | 5/2000 | Hardt et al. |
| 6,115,250 A | * | 9/2000 | Schmitt ................. 361/695 |
| 6,129,429 A | | 10/2000 | Hardt et al. |
| 6,141,209 A | | 10/2000 | Kerrigan et al. |
| 6,201,702 B1 | | 3/2001 | Schmitt |
| 6,208,522 B1 | | 3/2001 | Manweiler et al. |
| 6,233,158 B1 | | 5/2001 | Leman |
| 6,238,026 B1 | | 5/2001 | Adams et al. |
| 6,246,576 B1 | | 6/2001 | Sands et al. |
| 6,259,605 B1 | | 7/2001 | Schmitt |
| 6,304,438 B1 | | 10/2001 | Liu et al. |
| 6,359,780 B1 | * | 3/2002 | McMahan et al. ......... 361/687 |
| 6,367,896 B1 | | 4/2002 | Peng et al. |
| 6,594,150 B2 | * | 7/2003 | Creason et al. ........... 361/727 |

* cited by examiner

Primary Examiner—Hung Van Duong
(74) Attorney, Agent, or Firm—Glen M. Diehl; Norton & Diehl LLC

(57) ABSTRACT

A telecommunications chassis includes one or more vents on a first side of the chassis and one or more vents in a second side of the chassis, one or more fans mounted inside the chassis and oriented to direct air flow inside the chassis from side to side, one or more open card slots inside the chassis between the one or more fans and the first side, and one or more hot-swappable power supplies inside the chassis between the one or more fans and the second side. One or more replaceable air filters over the one or more side vents, as optional are also included. The open card slots may be cPCI compliant. The chassis may also include an alarm card.

27 Claims, 14 Drawing Sheets

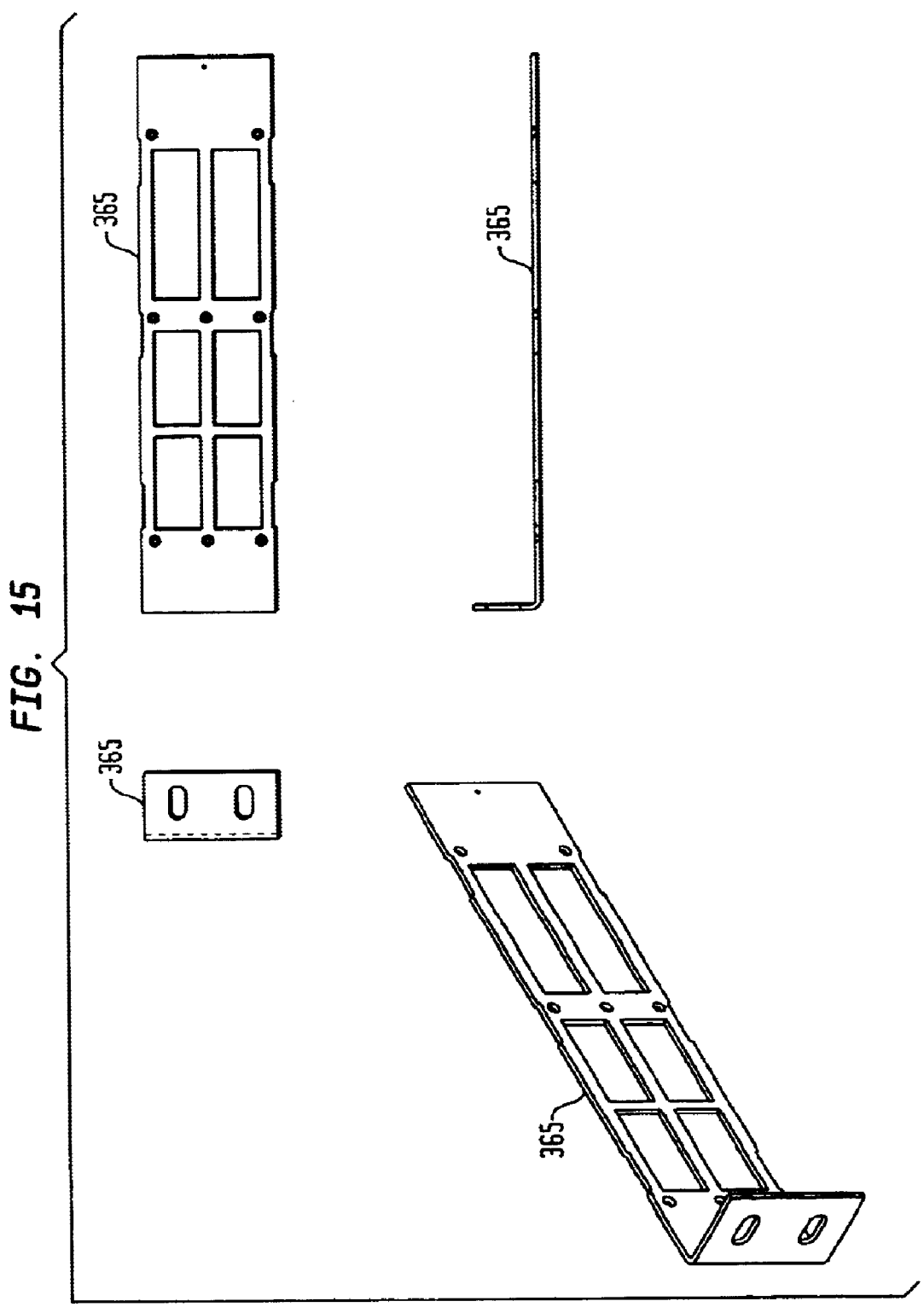

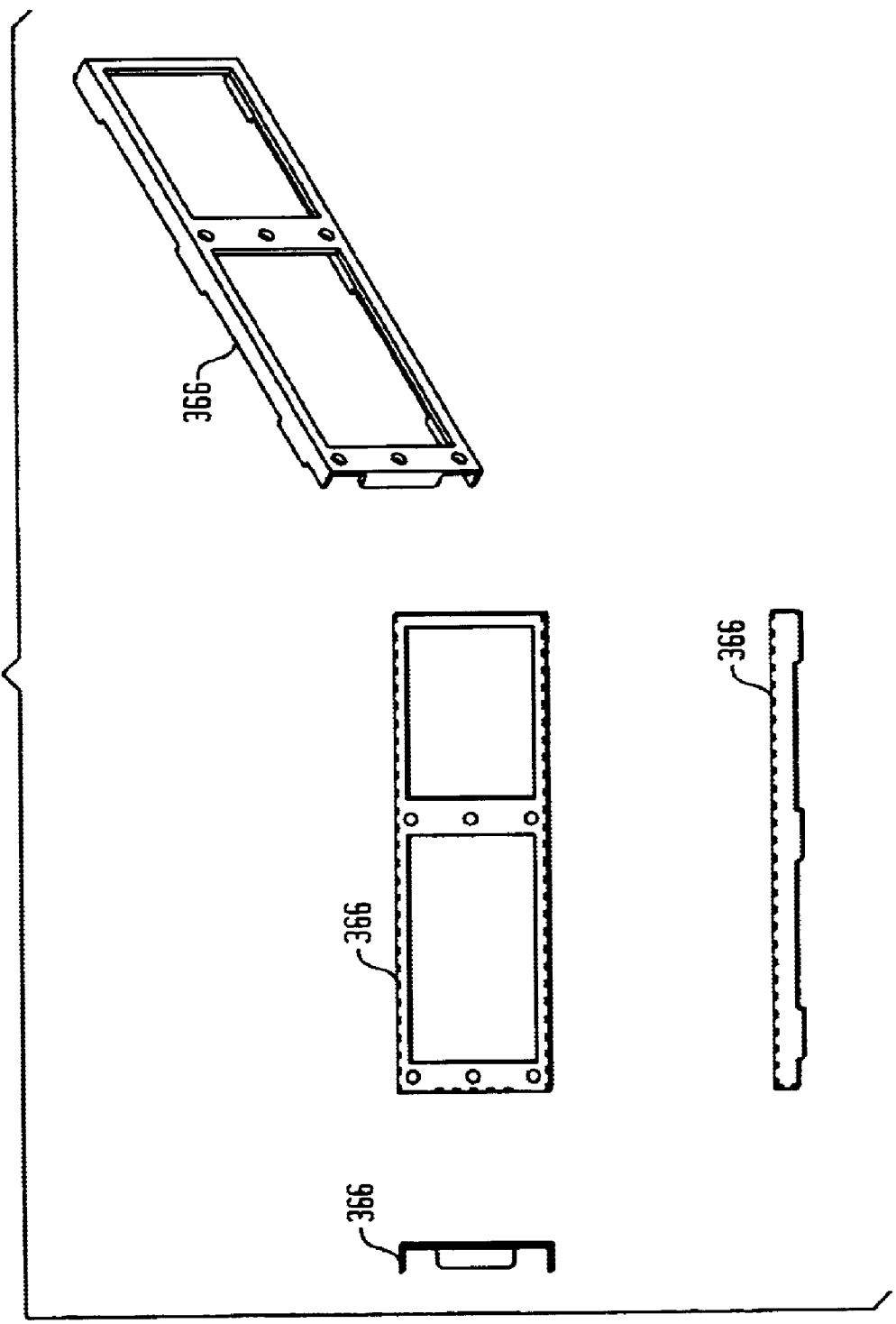

TELECOMMUNICATION CHASSIS

BACKGROUND OF THE INVENTION

The present invention generally relates to the embedded telecommunication environment and to the chassis solutions available in this environment.

Space is always a problem in the embedded telecommunication environment. Today's telecommunication engineering applications require the performance of a greater number of applications in less space, and these demands are continuing to increase. For example, greater densities, higher capacities, hot swapping capabilities and disk mirroring are being required in many applications. As a result, space is becoming a major engineering issue.

These requirements and others are stressing the capacity of available chassis solutions for telecommunication devices. Current chassis solutions do not provide the ability to increase the density of the electronics embedded in a chassis. They also do not adequately provide alarm systems that monitor the conditions of the telecommunication devices without sacrificing space normally used for the embedded electronics. Further, the available chassis solutions do not adequately provide dual power supplies to provide fault-tolerant operations.

Additionally, the low available density of embedded electronics and resulting inefficient use of space of current chassis solutions means that servicing such units often requires swapping out bulky and heavy chassis. Thus, chassis allowing higher density and resulting space efficiency to effectuate smaller field replaceable units (FRUs) are needed.

The density of electronics is limited by the ability to provide cooling of the electronics. Current chassis solutions do not efficiently provide cooling for the electronics located within the chassis, thereby limiting the capabilities existing chassis solutions. Accordingly, new telecommunication chassis solutions that provide adequate cooling are needed.

SUMMARY OF THE INVENTION

The present invention provides an electronic device that includes a chassis, one or more fans mounted inside the chassis, one or more open card slots available inside the chassis and a power supply that is also mounted inside the chassis. The chassis has a first plurality of vents on a first side of the chassis and a second plurality of vents on a second side of the chassis. The one or more fans are mounted inside the chassis and oriented to direct air flow inside the chassis from side to side. The open card slots that are available inside the chassis are located between the one or more fans in the first side of the chassis. The power supply mounted inside the chassis is located on the other side of the one or more fans, so that it is between the one or more fans and the second side of the chassis. In accordance with a preferred embodiment of the present invention, the one or more fans direct the air flow inside the chassis from the underlying first side to the second side.

A second power supply can also be provided inside the chassis. The second power supply is located alongside the first power supply, between the one or more fans and the second side.

An alarm card can also be provided inside the chassis. The alarm card is connected to the power supplies to monitor input voltage as well as output voltage of the power supply. The alarm card is also connected to the one or more fans to monitor the operation of the fans. The alarm card is preferably mounted next to the power supply, between the one or more fans and the second side of the chassis.

A hard drive can also be provided inside the chassis. The hard drive is preferably mounted between the one or more fans and the second side of the chassis.

It is also preferred to provide a replaceable air filter on one of the plurality of vents. The replaceable air filter is preferably provided on the side of the chassis that takes in air as a result of the operation of the one or more fans.

Further, the device of the present invention is preferably cPCI compliant.

It is understood that both the foregoing general description and the following detailed description are exemplary and are intended to provide further explanation of the invention claimed.

The accompanying drawings, which are incorporated in and constitute part of this specification, and are included to illustrate and provide a further understanding of the method, medium and system of the invention. Together with the description, the drawings serve to explain the principles of the invention.

BRIEF DESCRIPTION OF THE DRAWINGS

FIG. 15 illustrates a modified vented side wall component rack mounting bracket in accordance with an exemplary embodiment of the preferred invention; and FIG. 16 depicts an air filter bracket in accordance with an exemplary embodiment of the preferred invention.

DETAILED DESCRIPTION

In accordance with a preferred embodiment of the invention, a device is provided to serve as a chassis for electronic components. More specifically, the device serves as a chassis for telecommunications system components.

Advantageously, a telecommunications chassis allowing a higher component slot density of electronic components for its form factor is presented.

The current invention also advantageously provides for efficient cooling for the electronics located within the chassis, by the physical arrangement of the cooling fan(s) and electronics cards. This preferably facilitates an increase in electronic card density.

Another advantage of the current invention is the incorporation in a preferred embodiment of an alarm card within the chassis, thereby not consuming an available component slot.

The current invention also advantageously provides one or more hot-swappable power supplies. In cases where more than one power supplies are used, this allows for one power supply to be removed without interrupting the operation of the electronic components housed by the chassis, as well as providing fault-tolerant operation in the event of a single power supply failure. If one power supply fails, the remaining power supply(ies) then supports the entire load.

Advantageously, in a preferred embodiment, the current invention provides superior electromagnetic interference (EMI) shielding through careful EMI sealing and EMI gasketing.

Another advantage of the current invention is that the preferably more densely packed device allows for field replacement units (FRUs). The physical box itself is of such a size that it can be replaced easily, as opposed to the larger boxes used in heavier and bulkier systems.

The chassis of the present invention, therefore, provides a compact and cost-effective solution for communications and data networking environments. Examples of typical applications this chassis can be used in include network management, intelligent network interfaces, virtual private network servers, SS7 platforms, internet proxy servers, security firewalls, VOIP, wireless applications, DNS, log processing, web hosting and user authentication.

Figure 1:
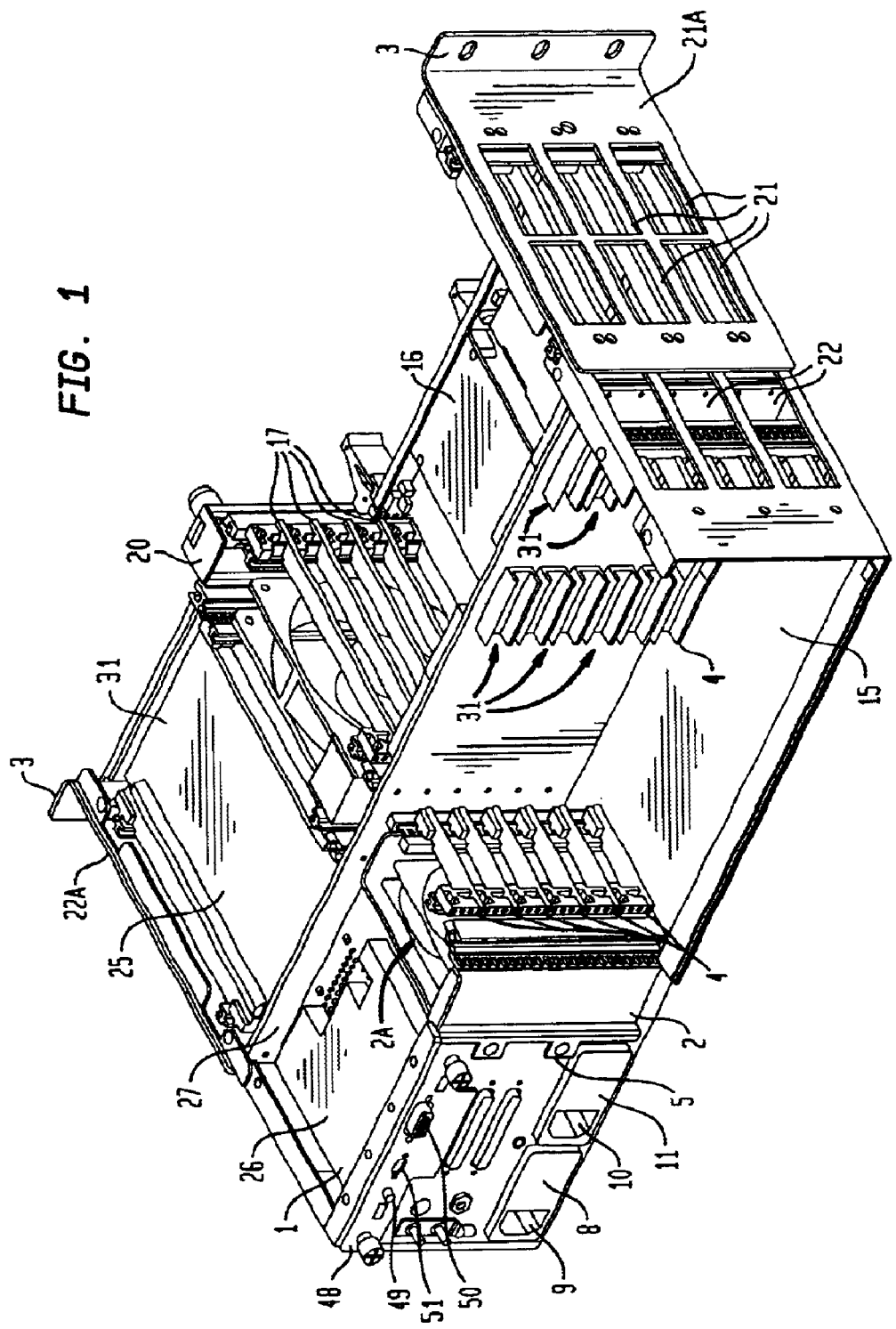
FIG. 1 is a rear oblique view of a telecommunication chassis with covering removed in accordance with a preferred embodiment of the present invention.

FIG. 1 is a rear oblique view of a telecommunication chassis with outer covering removed in accordance with a preferred embodiment of the present invention. An alarm card 1 is preferably provided. The alarm card 1 monitors the status of the chassis' built-in systems, preferably including the power supply(ies) and cooling fan(s). The input and output voltages of each power supply are preferably monitored. Further, it is preferred to monitor chassis temperatures. Dry contact signals for external alarm monitoring, system notification and LED operations are preferred outputs of the alarm card. The alarm card 1 is preferably a field replaceable unit, so that field maintenance craft can hot swap the alarm card in fielded operation without effecting system operation. The alarm card 1 is situated so as not to require the use of any of the expansion slots of the chassis, increasing the amount of space available for expansion cards.

Also shown is a rear fan tray 2, and a thumbscrew 5 for removing or installing the rear fan. Alternative attachment mechanisms exist that may be used in place of the thumbscrew 5, as are well known in the art. A rear fan 2A is preferably installed in the rear fan tray 2 position, thereby increasing the ability to cool the electronic components housed by the chassis, including the power supply(ies), alarm card 1, and electronic cards installed in the available expansion slots. Additionally, multiple fans can be optionally installed in the fan tray 2.

Rack mounting flanges 3 are provided in a preferred embodiment to allow the chassis and its contents to be mounted securely to a component rack. Use of this flange 3 provides stability to the entire unit by coupling the chassis to a larger and usually heavier components rack. The mounting flange 3 also provides electromagnetic compatibility (EMC) earth safety grounding.

Expansion slots 4 in the rear and expansion slots 17 in the front of exemplary embodiments of the chassis are partially visible in FIGS. 1, 2(a), 2(b), 3, 4, 6, 9, 10, and 11. The electronic components, usually printed circuit cards, that occupy these slots are dependent on the application being served as required and defined by a user/operator. The number of expansion slots will vary in accordance with the application. In one embodiment of the chassis, four expansion slots are provided. In another embodiment of the chassis, six expansion slots are provided. In a further embodiment of the chassis, eight expansion slots are provided. In each of these embodiments, one of the slots is preferably configured to hold a system processor card.

In the chassis illustrated in FIGS. 1, 3, 4, and 6, there are six expansion slots 4, with the lowest of the slots 4 preferably configured to hold a system processor card, if one is to be used. Use of a processor card and its location, if used, are not required in order to practice the invention.

Preferably, in applications where a processor card is employed in one of the slots, preferred embodiments of the processor cards include the SUN™ series of cPCI processors, the MOTOROLA™ MCP750 series of cPCI CPU modules using PowerPC 750 microprocessors at 233, 366, or 400 MHz, with 32 to 256 MB of RAM, as well as the INTEL® Ziatech ZT5503 or ZT5504 cPCI System Master processor board using an 800 MHz PENTIUM® III with 512 MB to 1 GB of ECC SDRAM and on-board flash memory. Of course, alternative processing boards using different processors, processor speeds, and memory configurations may be used.

Operating software for the processor card and its controlled devices is also used in applications needing a processor card. A preferred embodiment of the present invention uses a Linux, VxWorks, or SOLARIS™ operating system, depending on the processor option selected and other factors, as known to one of ordinary skill in the art. Other operating systems may also be used without departing from the scope of the present invention.

In a preferred embodiment the expansion slots are located in a rear expansion slot bay 15 and in a front expansion slot bay 16, which are partially visible in FIGS. 1, 3, 4, and 6. Expansion slot bay 16 is strategically positioned between cooling fan 20 and the side wall 21A containing side wall vents 21. Note that multiple cooling fans can be used in the position occupied by the single cooling fan 20. Additionally, expansion slots 17 are preferably oriented so that electronic component cards (not depicted) populating the front expansion slot bay 16 form a series of horizontal trays, with the cooling fan 20 at one end of the cards, and the side wall vents 21 at the other end of the cards. This preferred positioning allows for an optimal gross cooling effect for the electronic component cards.

Similarly, in a preferred embodiment, rear expansion slot bay 15 is strategically positioned between the rear fan tray 2 and side wall 21A containing rear side wall vents 22. The expansion slots 4 of the rear expansion slot bay 15 are also preferentially oriented so that electronic component cards (not depicted) populating the rear expansion slot bay 16 form a series of horizontal shelves, or tables, with the rear fan tray 2 at one end of the cards, and the rear side wall vents 22 at the other end of the cards. It is also preferable that a cooling fan (not depicted) similar to cooling fan 20 be installed in the rear fan tray 2 when populating expansion slot bay 15. This cooling fan 20 and the cooling fan 2A in the rear fan tray 2, should preferably be sized to fit within the space available and to provide adequate airflow so as to adequately cool the electronics within the chassis.

The front expansion slot bay 16 and the rear expansion slot bay 15 are separated by a wall 27 that extends from the side wall 21A the to the side wall 22A. The fans 2A and 20 are also preferably on opposite sides of the wall 27.

As shown in FIG. 1, a series of connectors 31 are provided in the rear expansion slot bay 15 and on the wall 27. These connectors 31, combined with the card slots 4, receive the cards required by the application in which the chassis is being used. The connectors 31 are preferably wired in accordance with different desired configurations within the cPCI specification.

Figure 3:
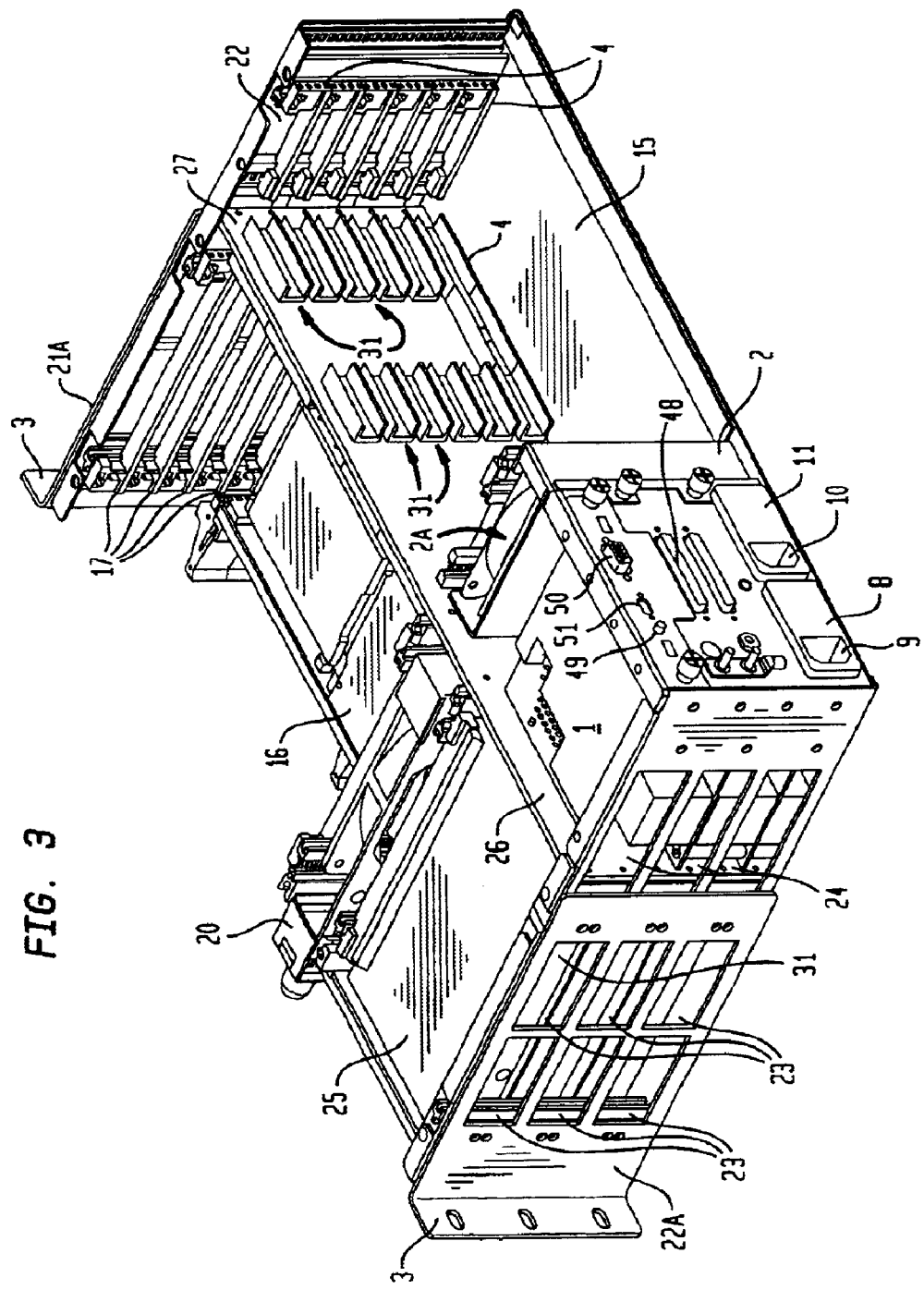
FIG. 3 is another rear oblique view of a telecommunication chassis with covering removed in accordance with a preferred embodiment of the present invention.

There are another series of connectors 32 preferably provided on the other side of the wall 27 in the front expansion slot bay 16, as illustrated in FIG. 3. These connectors 32, combined with the card slots 17, receive the cards required by the application in which the chassis is being used. These connectors 32 are also preferably wired in accordance with different desired configurations within the cPCI specification.

Figure 4:
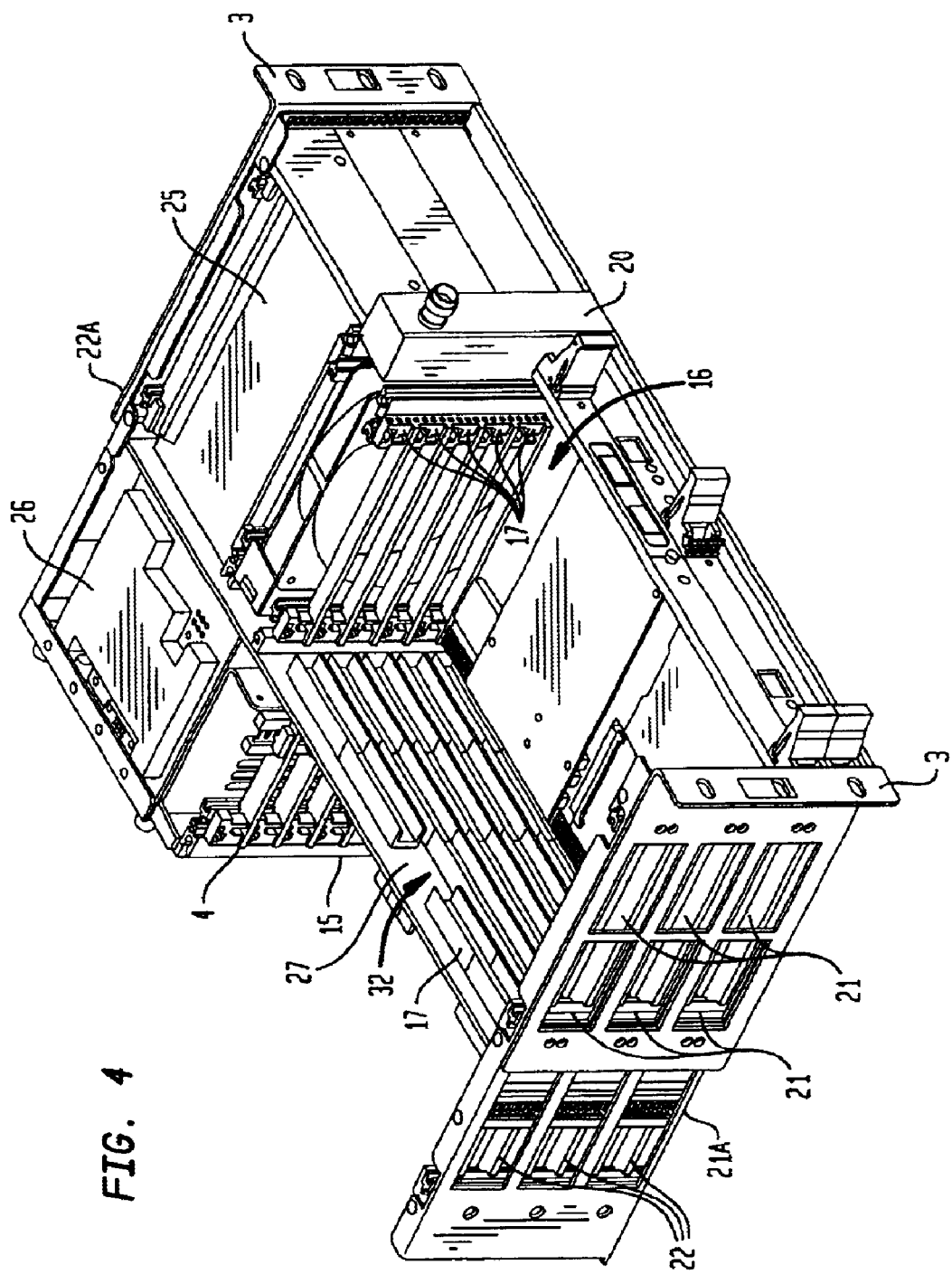
FIG. 4 is a front oblique view of a telecommunication chassis with covering removed in accordance with a preferred embodiment of the present invention.

Preferably adjacent to the cooling fan 20 and opposite the expansion slot bay 16 is a first component area 25, partially visible in FIGS. 1, 3, and 4. The first component area 25 can also be described as being located between the cooling fan 20 and the side wall 22A. A second component area 26 is located adjacent to the rear fan tray 2, opposite the expansion slot bay 15 in a preferred embodiment. The second component area 26 can also be described as being preferably located between the cooling fan 2A in fan tray 2 and the side wall 22A. The first component area 25 and the second component area 26 are on opposite sides of the wall 19.

The first component area 25 may be used to house various components, including but not limited to, mass storage devices, communications equipment, and power supplies. Thus, a hard drive 31 and additional hard drives, if necessary, may be installed in the first compartment area 25. Any standard hard drive can be used. The second component area 26 is preferentially used to house one or more power supplies, as well as an alarm card 1. Configuration and contents of the component areas 25, 26 are advantageously alterable by the user/operator to suit the user/operator's particular needs. As an example, if a user/operator requires the system(s) housed in the chassis to be reliably operated at all times, additional power supplies may be installed in either or both of the component areas 25, 26. Alternatively, if the application requires a large amount of mass storage, component areas 25, 26 may be configured to include one or more suitable disk drives or other mass storage devices, in addition to necessary device controller card(s).

In preferred embodiments, alternating current (AC) or direct current (DC) power supplies may be used. FIGS. 1, 2(a), 3, and 11 depict an exemplary chassis using dual AC power supplies. Preferably, feed A power supply 8 includes an AC power input 9, a power switch 44 (depicted only in elevation views FIGS. 2(a) and 11), and a 115/230 voltage selector switch 46 (depicted only in elevation views FIGS. 2(a) and 11). Alternatively, an "auto-ranging" voltage supply may be used, whereby a voltage selector switch is not necessary, as is commonly known in the art.

Figure 2A:
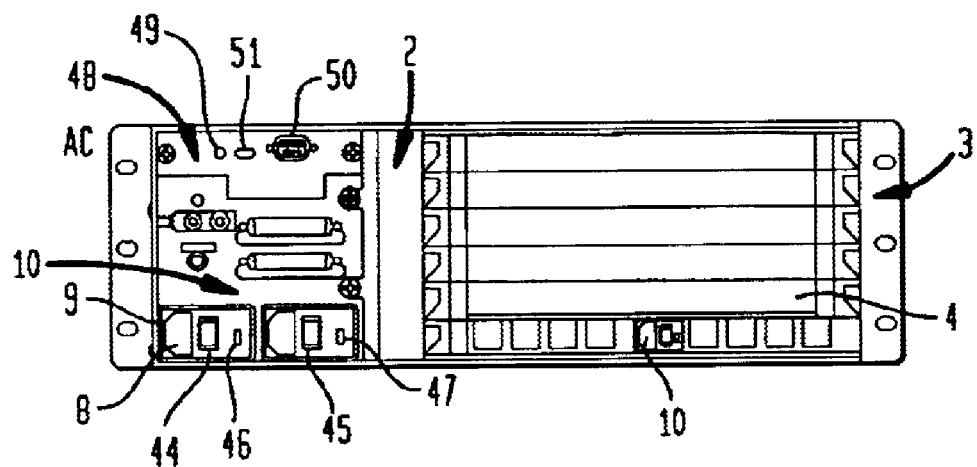
FIGS. 2(*a*) and 2(*b*) are rear elevation views of an alternating current (AC) and direct current (DC) exemplary embodiments, respectively, of a telecommunication chassis in accordance with the present invention.
Figure 11:
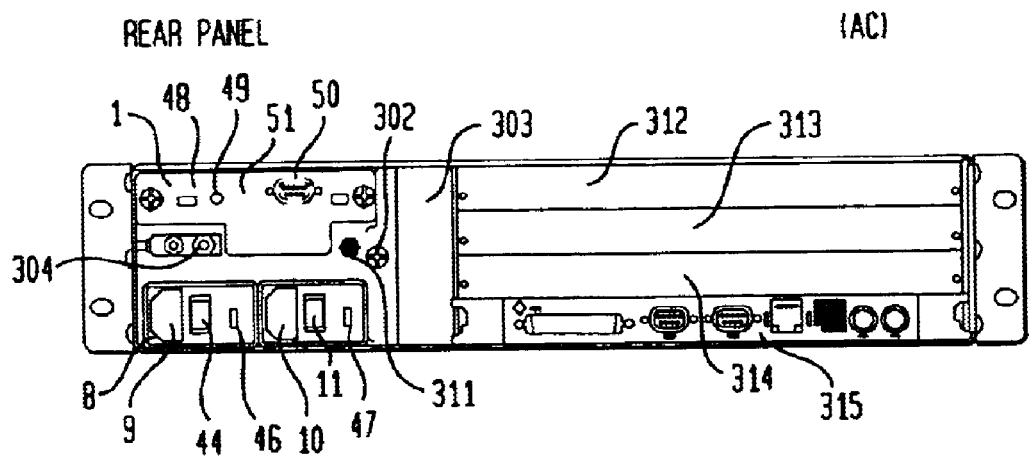
FIG. 11 is a rear elevation view of a telecommunication chassis in accordance with an AC exemplary embodiment of the preferred invention.

Similarly, feed B power supply 11 preferably includes an AC power input 10, a power switch 45 (depicted only in elevation views FIGS. 2(a) and 11), and a 115/230 voltage selector switch 47 (depicted only in elevation views FIGS. 2(a) and 11). Use may be made of alternative power supply configurations, as is well known to those of ordinary skill in the art. Moreover, the number of power supplies may range from one to many, depending on the needs of the application for which the chassis is utilized.

The AC power inputs 9, 10 allow connection to a source of AC power using standard AC power cords, as are in common use in the electronics industry. Power switches 44, 45 gate the power input to their corresponding power supply. In a typical "hot-swapping" operation using dual power supplies, both power switches would typically be in the "ON" position. When a "hot-swap" is to be performed, the power switch for the power supply being replaced may preferably, but not necessarily, be turned to its "OFF" position, and the power supply unit is removed. The electrical load originally supported by both power supplies is then fully supported by the remaining power supply. Optionally, a replacement power unit is installed. If its power switch is initially in the "OFF" position switch of replacement power unit may then be turned to its "ON" position. Thus, the two power supplies may then share the electrical load from the chassis components, completing the hot-swap.

Hot-swapping is particularly useful in mission critical systems, such as those employed in the telecommunications industry. In such systems, it is important for the various electronic components housed in telecommunication chassis to operate continuously online, with little or no offline or down time. Redundant, hot-swappable, alarmed power supplies, as well as other fault-tolerant redundancies are significantly advantageous in these systems. Hot-swappable power supplies are well known in the art.

Although a hot-swap of power supplies may be performed at the will of the operator, it is frequently the case that the operated has been notified by an alarm or other monitoring device that a power supply has or is about to fail. In such cases user/operator may act to hot swap the power supply.

Figure 2B:
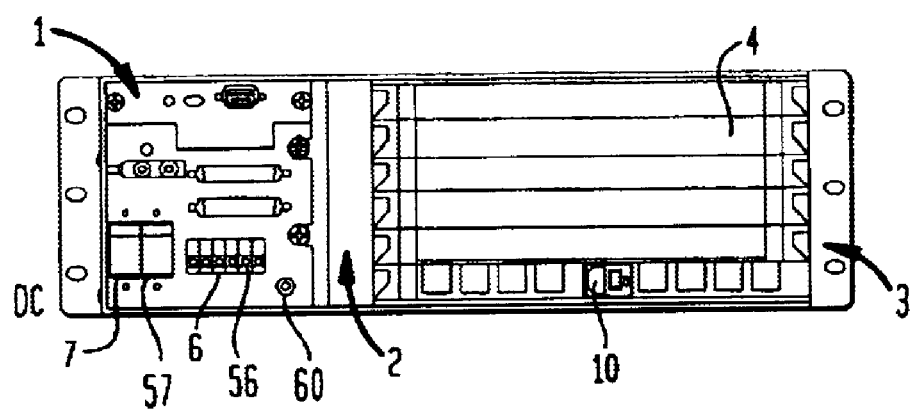
Figure 10:
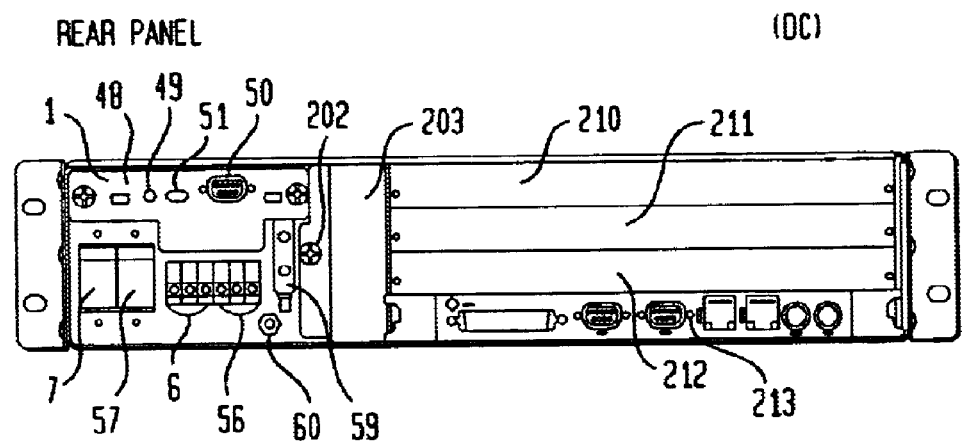
FIG. 10 is a rear elevation view of a telecommunication chassis in accordance with a DC exemplary embodiment of the preferred invention.

As an example of alternative power supplies, FIGS. 2(b) and 10 depict exemplary chassis using dual DC power supplies. Preferably, the dual DC power supplies include a feed A circuit breaker 7, a feed B circuit breaker 57, a feed A power input 6 (from left to right, the connections are: V+, V−, and frame ground), and a feed B power input 56 (from left to right, the connections are: V+, V−, and frame ground). The DC power supplies may also include an electrostatic discharge (ESD) grounding lug 59, as well as an ESD jack 60. The ESD grounding lug 59 provides a convenient location for field service maintenance craft to plug in an ESD wrisp strap for allowing correct handling of ESD sensitive components. Feed A and B circuit breakers 7, 57 operate to protect against overcurrent conditions that might otherwise harm the power supplies. If a dangerous power surge occurs to one or both power feeds, the circuit breaker for the appropriate power feed will trip, causing the power to be cut off from that unit.

Preferably, a grounding lug 59 provides a means of grounding the DC power supplies, although frame grounding is also available from the third connection on each of the power inputs 6, 56.

The ESD jack 60 preferably reduces the risk of damage to equipment and allows the user/operator to avoid receiving a static discharge when handling the operating power supplies, for instance during a hot-swap procedure, by providing a discharge point for static electric buildup, which may be drained by a suitable grounding apparatus. When performing routine maintenance on the unit, a wrist strap should be used and plugged into the ESD jack 60.

In a preferred embodiment, the type of alarm card 1 used may vary depending on other components installed on the chassis. In an exemplary system configuration for use with systems incorporating an Intel ZT5503 processor, the alarm card 1 may be a PIC microcontroller-based card used to monitor the cooling fans, power supply input and output voltages, and other system parameters.

Preferably, the exemplary microcontroller-based alarm card 1, as partially depicted in FIGS. 1, 2(a), 2(b), 3, 10 and 11, includes a faceplate 48, a tricolor status LED 49, a DB9 alarm port 50, and optionally a microDB9 alarm port 51. A microprocessor-based alarm card may alternatively be used. The alarm card may preferably interface with the host CPU through either an $I^2C$ interface or RS-232 serial port. Ideally, the tricolor status LED 49 indicates system status by use of three colors. In an exemplary system, the tricolor status LED 49 emits a green light indicating an acceptable system status, an amber light indicating a problem or pending failure detected, or a red light indicating a system failure. Preferably, a power supply failure signal, as well as other optional signals, are supported on a DB9 alarm port 50, as well as on the microDB9 alarm port 51, if installed. These signal(s) may then be monitored over communication lines, allowing a single user/operator to track many similarly equipped systems simultaneously.

Figure 12:
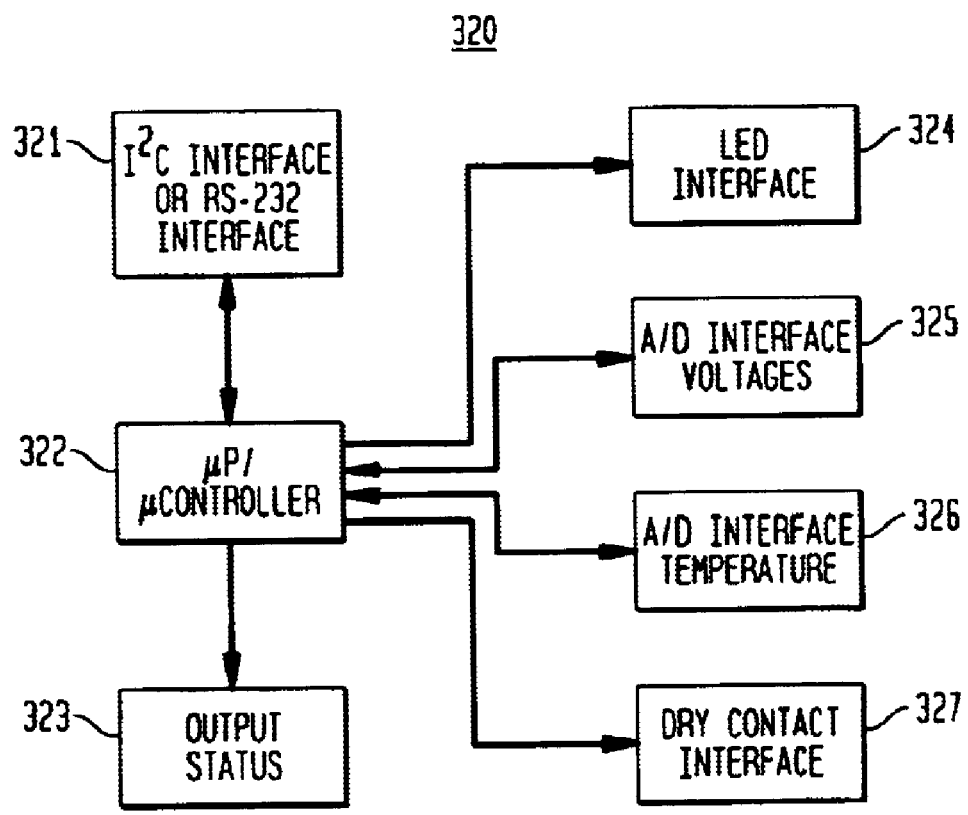
FIG. 12 illustrates a block diagram of an alarm card in accordance with a preferred embodiment of the invention.
Figure 13:
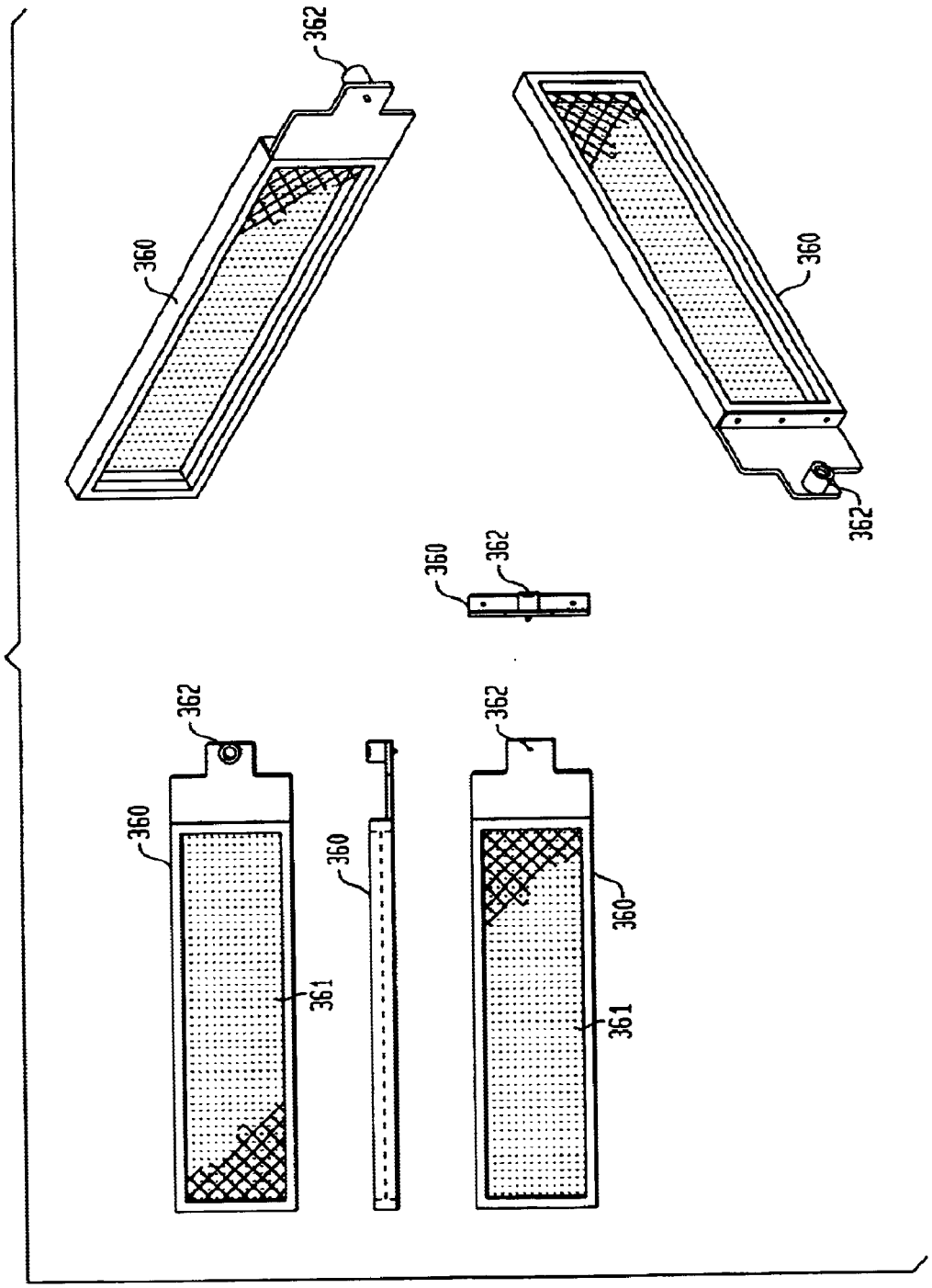
FIG. 13 illustrates the removable air filters and cartridge used in accordance with a preferred embodiment of the present invention.
Figure 14:
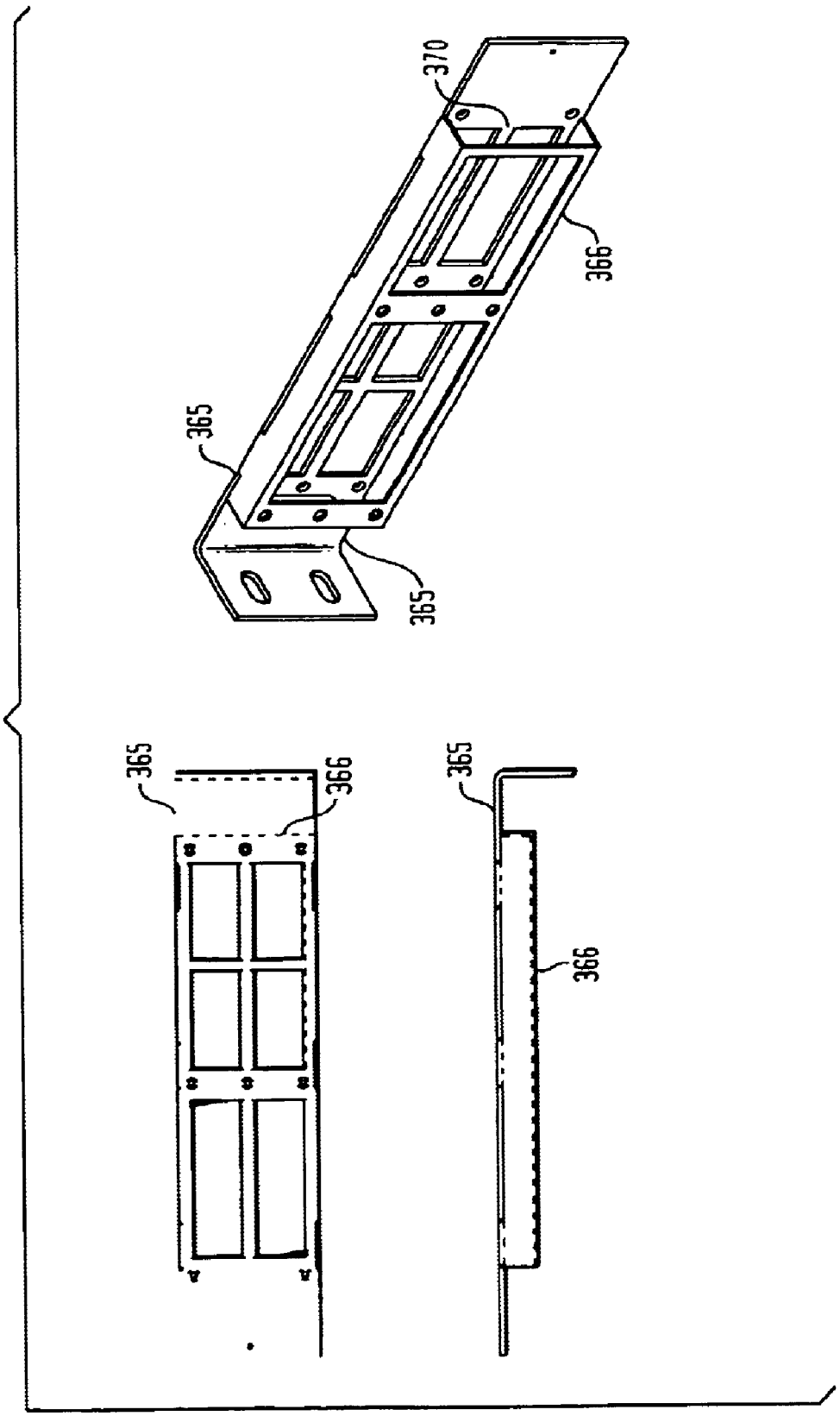
FIG. 14 depicts a modified vented side wall component rack mounting bracket with an integrated air filter bracket in accordance with an exemplary embodiment of the preferred invention.

FIG. 12 illustrates a block diagram 320 of the alarm card in accordance with a preferred embodiment of the present invention. A microcontroller or microprocessor-based circuit 322 monitors analog/digital (A/D) interfaces to one or more power supplies 325 to monitor voltages at the input of the power supplies, at the output of the power supplies and at various other locations, such as at various points on interface buses. It also monitors A/D interfaces to one or more temperature sensors 326 to detect chassis temperatures. It also provides outputs to an LED interface 324 and to a dry contact interface 327 to indicate the operational status of the chassis. The microprocessor-based circuit 322 is in communication with the system processor, if one is used, via an $I^2C$ interface 321, RS-232 interface 321, IPMI interface, or other communications interface, as is commonly used in the art.

Component areas 25, 26 are preferably positioned adjacent to the front and rear side wall vents 23, 24, respectively, as portrayed in FIG. 3. Overall, the preferable arrangement in the front portion of the chassis is front side wall vent 23, first component area 25, cooling fan 20, expansion slot bay 16, and front side wall vent 21. This arrangement allows for efficient cooling of the contents of both the first component area 25 and expansion slot bay 16, using cooling fan 20. Likewise, the preferable overall arrangement in the rear portion of the chassis is rear side wall vent 24, second component area 26, rear fan tray 2 preferably including a second cooling fan 2A, expansion slot bay 15, and rear side wall vent 22.

In a preferred mode of operation, the cooling fans 20, 2 cause a flow of cooling air to be drawn into the expansion slot bays 15, 16 through the side wall vents 21, 22. The cooling air then continues through the aforementioned cooling fans, through the first and second component areas 25, 26, and exits the side wall vents 23, 24, thereby reducing heat buildup within the chassis.

Alternatively, the direction of the flow of air may be reversed by reversing the direction of motion of the cooling fans.

As previously described in a preferred embodiment of the current invention, the wall 27 divides the chassis into a front and back section. This wall 27 separates the first component area 25 from the second component area 26, and the expansions slot bays 15, 16 from each other. The wall 27 may contain numerous holes or gaps, allowing cooling air to flow and circulate between the front and back of the chassis. If such a wall 27 is employed, it may be preferable to not install a second cooling fan in the rear fan tray 2, provided the cooling efficiency of the cooling fan 20 is sufficient for the particular components installed in the chassis and other pertinent factors known to one of ordinary skill relating to cooling (e.g., number and wattage of power supply(ies), ambient room temperature, humidity, etc.) Alternatively, if a solid or only slightly porous wall 27 is employed, it is advantageous to install a second cooling fan in the rear fan tray 2.

Figure 5:
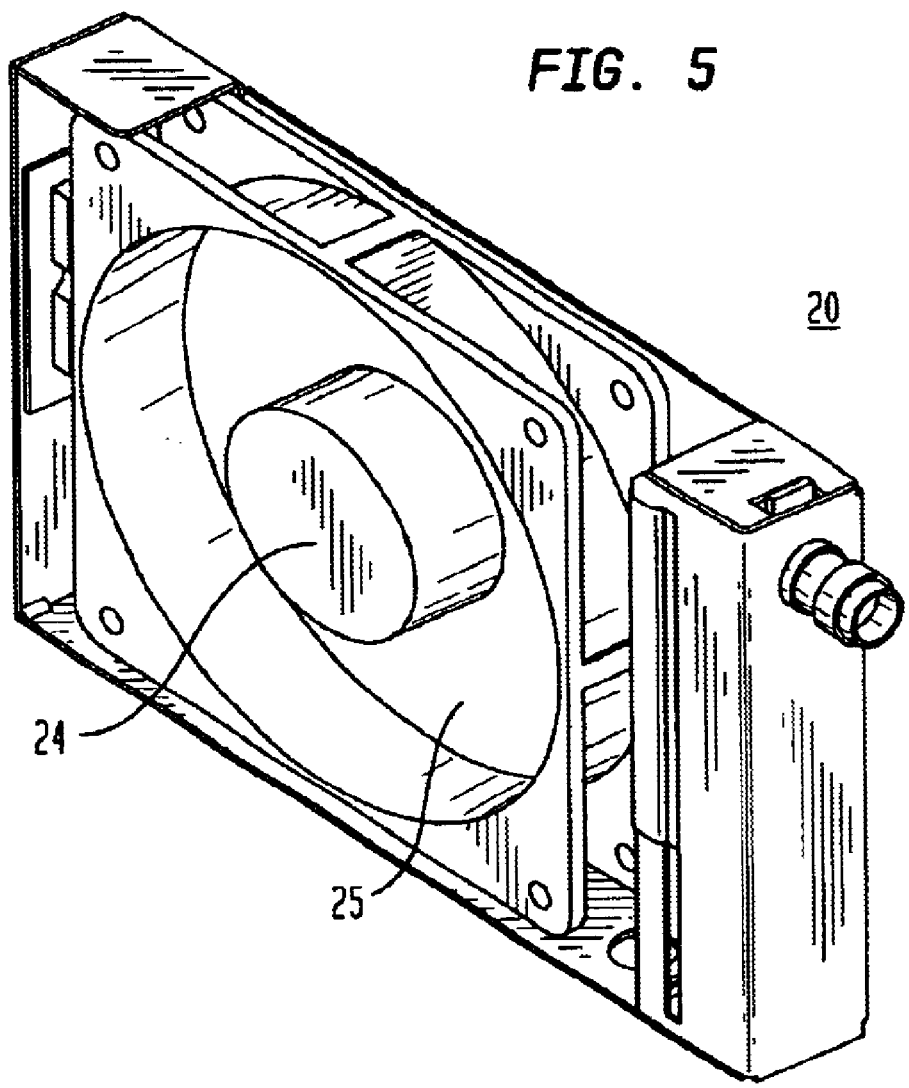
FIG. 5 is an oblique view of a fan tray containing a fan (blades not depicted for clarity) and motor in accordance with a preferred embodiment of the present invention.
Figure 6:
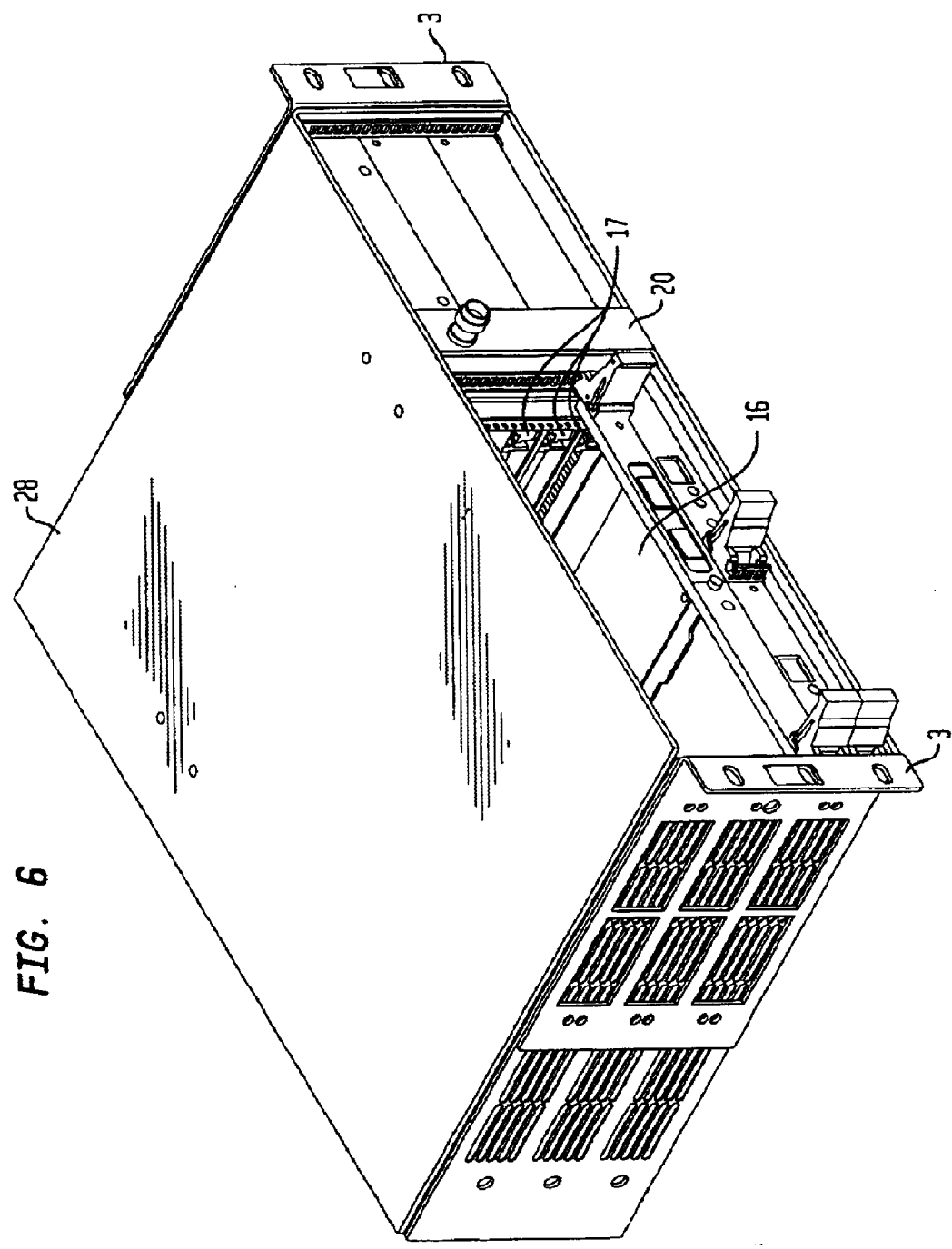
FIG. 6 is a front oblique view of a telecommunications chassis in accordance with a preferred embodiment of the present invention.

FIG. 5 is a depiction of an exemplary fan tray 20 containing a fan (blades not depicted for clarity) and motor 24. A preferred embodiment includes a general-purpose cooling fan as in common use in the computer and electronics industry. Besides the form factor (being able to fit within the available space and meet other requirements, such as power needs), the cooling fan should be selected for reliability and cost efficiency. FIG. 5 shows an exemplary fan tray in which the fan rotates through the donut-shaped space 25, about the motor 24, generating a cooling airflow orthogonal to the plane of rotation. Use of alternative fan designs are, of course, permitted and within the scope of the invention. An additional fan of similar design may be installed in rear fan tray 2, if needed to provide adequate cooling.

FIGS. 13, 14, 15 and 16 illustrate an air filter 361, air filter cartridge 360, and modified vented side wall component rack mounting bracket 365 for housing an air filter bracket 366 of a preferred embodiment of the invention. The air filter 361 is mounted or attached to an air filter cartridge 360. The attachment is preferably permanent, but can also be semi-permanent. The air filter 361 material depends upon the application and the size of the particulate that is desired to be filtered. The filter cartridge is preferably metal. The filter cartridge is sized to fit securely within an area 370 defined by the modified vented side wall component rack mounting bracket 365 and an air filter bracket 366. The modified rack mounting bracket 365 is preferably fastened into place on the chassis on the side walls 21A and 22A. A fastener 362, preferably a thumbscrew, is provided on the air filter cartridge 360 to secure the air filter cartridge 360 to the modified vented side wall component rack mounting bracket 365. Although the modified rack mounting bracket 365 is mounted to the chassis using permanent or semi-permanent fasteners, the air filter cartridge 360 is free to be inserted or removed easily once the fastener 362 is loosened.

The air filter and the associated housing of FIGS. 13 to 16 are exemplary. The size and the openings of the air filter and the associated housing should be adjusted in accordance with the chassis being filtered. Thus, if a larger chassis is used, a larger filter can be used, and more openings in the associated housing can be provided.

The air filter and the associated housing of FIGS. 13 to 16 are preferably mounted to the chassis side whose vents operate to intake air. Thus, if the intake vents are on the side 21A, the air filter and the associated housing is mounted on the side 21A. On the other hand, if the intake vents are on the side 22A, then the air filter and the associated housing is mounted on the side 22A. In accordance with an alternate embodiment, the air filter and the associated housing can be mounted on both of the sides 21A and 22A.

Figure 7:
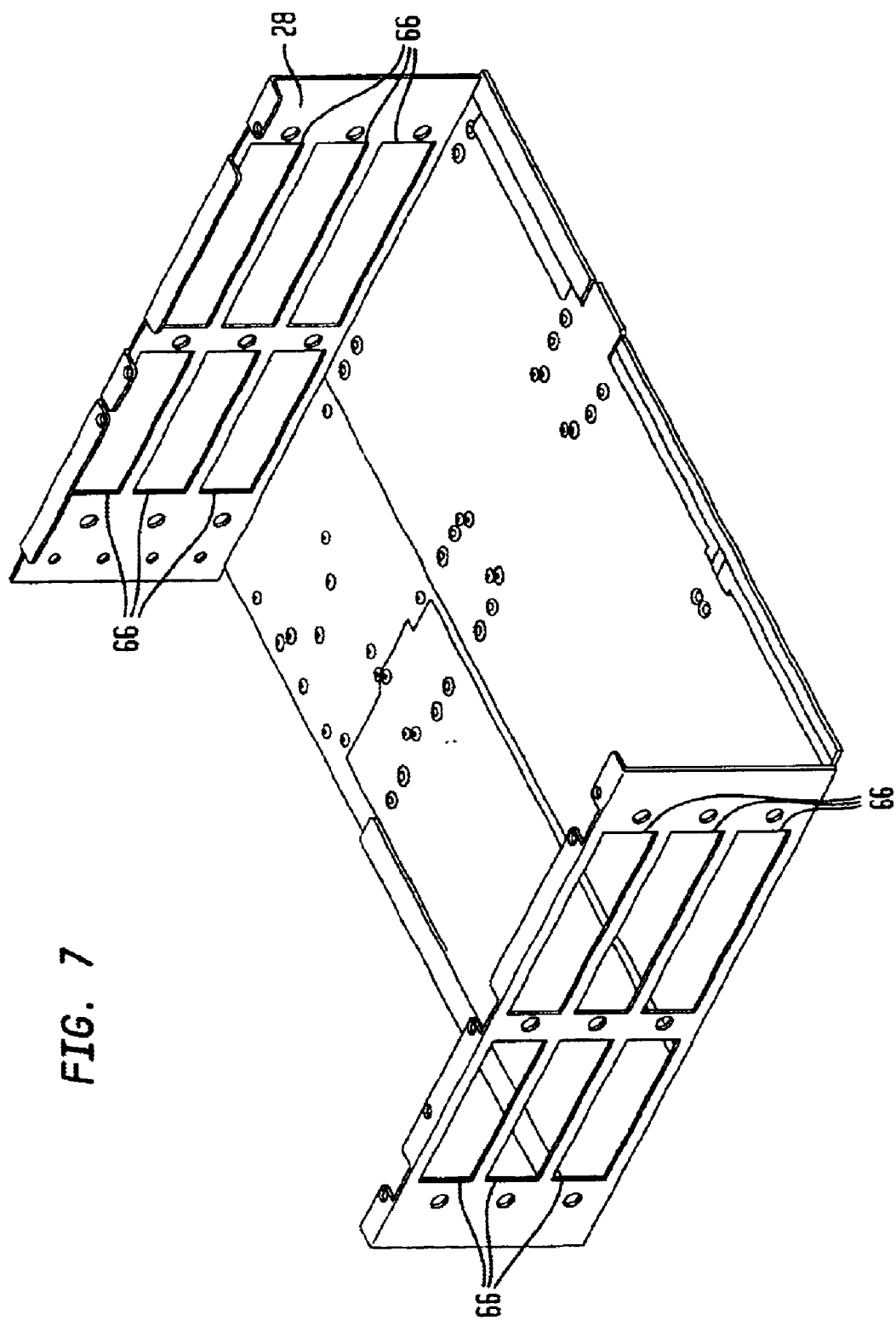
FIG. 7 is an exemplary lower protective covering of a telecommunication chassis in accordance with a preferred embodiment of the present invention.
Figure 8:
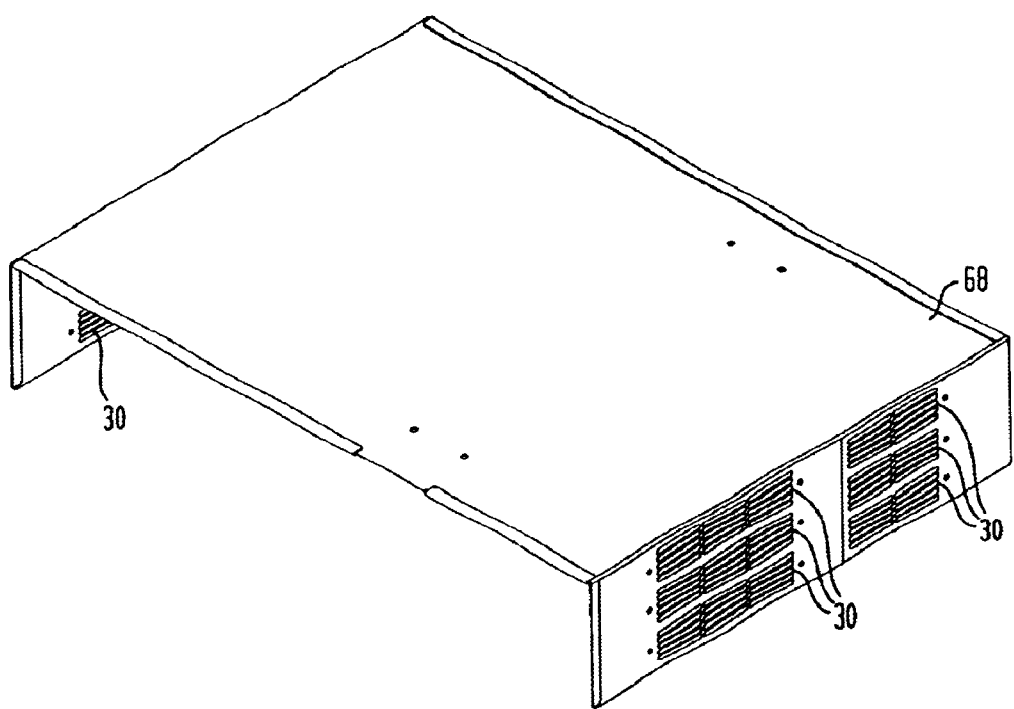
FIG. 8 is an exemplary upper protective covering of a telecommunication chassis in accordance with a preferred embodiment of the present invention.

FIGS. 7 and 8 show exemplary lower and upper protective coverings for the telecommunication chassis of a preferred embodiment. The protective coverings are preferably metal of a sufficient gauge to block EMI to an acceptable degree, as is well known in the art. Further, the telecommunication chassis is preferably, but not necessarily, compliant with cPCI specifications.

The lower protective covering 28 provides support and shielding for the chassis from below and either side. The bottom portion is preferably solid with a limited number of holes drilled to allow the covering 28 to be mounted to the chassis. The side walls include ventilation slots 66 that align with similar slots on the chassis 21, 2.2 and on the upper protective covering 30. These slots allow for the free passage of cooling air from one side of the chassis through to the other side of the chassis.

The upper protective covering 68, as already mentioned, includes ventilation slots 30 on the sides. These slots 30 are further slotted with an integral grating in a preferred embodiment. This grating serves to prevent large airborne debris from being drawn into the chassis, and to block some transmission of EMI. The upper protective covering 68 preferably snugly fits over and onto various flanges on the lower protective covering 28, so as to form a tightly sealed containment. Various alterations of protective coverings, as known in the art, may be employed without deviating from the scope of the invention.

Figure 9:
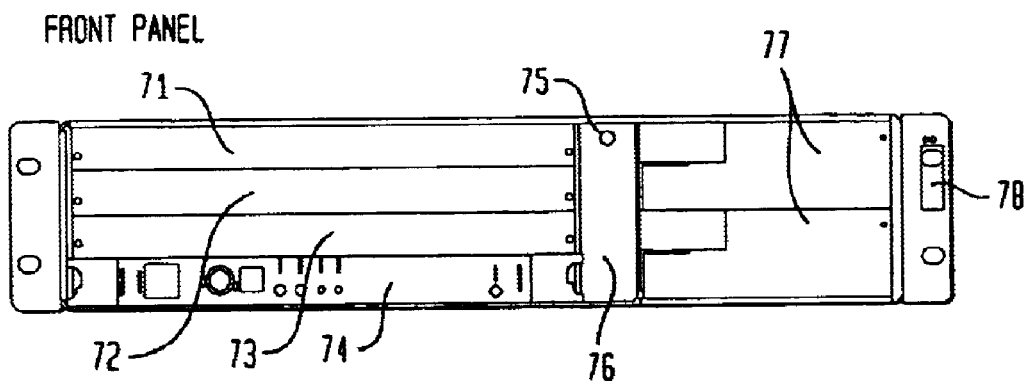
FIG. 9 is a front elevation view of a telecommunication chassis in accordance with an exemplary embodiment of the preferred invention.

FIG. 9 is a front elevation view of a telecommunication chassis in accordance with an exemplary embodiment of the invention. The chassis includes three expansion slot filler panels 71, 72, 73, a processor filled slot 74 (with a CP1500 processor card pictured), a fan tray spring latch 75, a fan tray 76, two hot-swappable power supplies 77, and the placement location of an optional front grounding lug 78.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A device, comprising;
    a chassis having one or more vents on a first side of the chassis and one or more vents in a second side of the chassis;
    a first mounting flange extending at about a ninety degree angle from the first side of the chassis and a second mounting flange extending at about a ninety degree angle from the second side of the chassis;
    one or more fans mounted inside the chassis and oriented to direct air flow inside the chassis from one of the sides of the chassis to the other side of the chassis;
    one or more card slots inside the chassis between the one or more fans and the first side; and
    a power supply inside the chassis between the one or more fans and the second side.

2. The device as claimed in claim 1, wherein the one or more fans direct air flow from the second side to the first side.

3. The device as claimed in claim 1, wherein the one or more fans direct air flow from the first side to the second side.

4. The device as claimed in claim 1, further comprising a second power supply inside the chassis between the one or more fans and the second side.

5. The device as claimed in claim 1, further comprising an alarm card inside the chassis between the one or more fans and the second side, the alarm card being connected to the power supply to monitor a voltage output by the power supply.

6. The device as claimed in claim 1, further comprising a hard drive inside the chassis between the one or more fans and the second side.

7. The device as claimed in claim 4, wherein the chassis is cPCI compliant.

8. The device as claimed in claim 1, further comprising a filter covering the vent through which air is taken into the chassis.

9. The device as claimed in claim 2, further comprising an air filter located over the one or more vents on the second side.

10. The device as claimed in claim 3, further comprising an air filter located over the one or more vents on the first side.

11. The device as claimed in claim 4, further comprising an alarm card inside the chassis between the one or more fans and the second side, the alarm card being connected to the power supply to monitor a voltage output by the power supply.

12. The device as claimed in claim 4, further comprising a hard drive inside the chassis between the one or more fans and the second side.

13. The device as claimed in claim 5, the alarm card being connected to the one or more fans to monitor the operation of one or more fans.

14. The device as claimed in claim 7, further comprising a hard drive inside the chassis between the one or more fans and the second side.

15. The device as claimed in claim 9, wherein the air filter is replaceable.

16. The device as claimed in claim 9, further comprising a hard drive inside the chassis between the one or more fans on the second side.

17. The device as claimed in claim 10, wherein the air filter is replaceable.

18. A device, comprising:
    a chassis having one or more vents on a first side of the chassis and one or more vents on in a second side of the chassis;
    a first mounting flange extending at about a ninety degree angle from the first side of the chassis and a second mounting flange extending at about a ninety degree angle from the second side of the chassis;
    one or more fans mounted inside the chassis and oriented to direct airflow inside the chassis from one of the sides of the chassis to the other side of the chassis;
    one or more card slots inside the chassis between the one or more fans and the first side;

two power supplies inside the chassis between the one or more fans and the second side; and an alarm card inside the chassis between the one or more fans and the second side, the alarm card being connected to the two power supplies to monitor one or more voltages output by the two power supplies.

19. The device as claimed in claim 18 wherein the one or more fans direct airflow from the second side to the first side.

20. The device as claimed in claim 18 wherein the one or more fans direct air flow from the first side to the second side.

21. The device as claimed in claim 18, the alarm card being connected to the one or more fans to monitor the operation of the one or more fans.

22. The device as claimed in claim 18, wherein the chassis is cPCI compliant.

23. The device as claimed in claim 18, further comprising a filter covering the vent through which air is taken into the chassis.

24. The device as claimed in claim 19, further comprising an air filter located over the one or more vents on the second side.

25. The device as claimed in claim 20, further comprising an air filter located over the one or more vents on the first side.

26. The device as claimed in claim 24, wherein the air filter is replaceable.

27. The device as claimed in claim 26, further comprising a hard drive inside the chassis between the one or more fans and the second side.

* * * * *